United States Patent [19]
Wenk

[11] Patent Number: 5,270,856
[45] Date of Patent: Dec. 14, 1993

[54] APPARATUS FOR THE OBSERVATION OF PROCESSES

[75] Inventor: Karl-Heinrich Wenk, Bad Nauheim, Fed. Rep. of Germany

[73] Assignee: Leybold AG, Hanau, Fed. Rep. of Germany

[21] Appl. No.: 864,514

[22] Filed: Apr. 7, 1992

[30] Foreign Application Priority Data

Nov. 14, 1991 [DE] Fed. Rep. of Germany ....... 4137414

[51] Int. Cl.[5] ............................................... G01P 3/40
[52] U.S. Cl. .................................... 359/507; 359/894; 118/713
[58] Field of Search .................... 356/23, 25; 359/507, 359/508, 894; 118/712, 713

[56] References Cited

U.S. PATENT DOCUMENTS

| | | | |
|---|---|---|---|
| 2,796,798 | 6/1957 | McCall | 356/25 |
| 3,170,383 | 2/1965 | Hunt | 118/713 |
| 3,316,463 | 4/1967 | Hanks | 118/713 |
| 3,678,889 | 7/1972 | Murakami et al. | 118/720 |

FOREIGN PATENT DOCUMENTS

| | | |
|---|---|---|
| 972408 | 7/1956 | Fed. Rep. of Germany . |
| 155288 | 6/1982 | Fed. Rep. of Germany ...... 118/713 |
| 3808682 | 9/1989 | Fed. Rep. of Germany . |

OTHER PUBLICATIONS

Machine Design Oct. 13, 1988 pp. 9, 10, 12, 16, 17, 20–22, 24, 33–38, 40–42, 44, 46, 48, . . . 68, 70–72, 74, 76–78, 80, 82–84.

Primary Examiner—F. L. Evans
Attorney, Agent, or Firm—Felfe & Lynch

[57] ABSTRACT

A tubular stroboscope is interposed in the line of sight between a viewing glass and a process to be viewed in a chamber. The stroboscope is rotated about a central axis transverse to the line of sight and has a pair of diametrically opposed slots parallel to said axis, one slot being substantially wider than the opposite slot. The stroboscope is preferably driven by a jet of inert gas acting on a drive wheel inside the chamber, aspiration means being provided for dust removal.

7 Claims, 3 Drawing Sheets

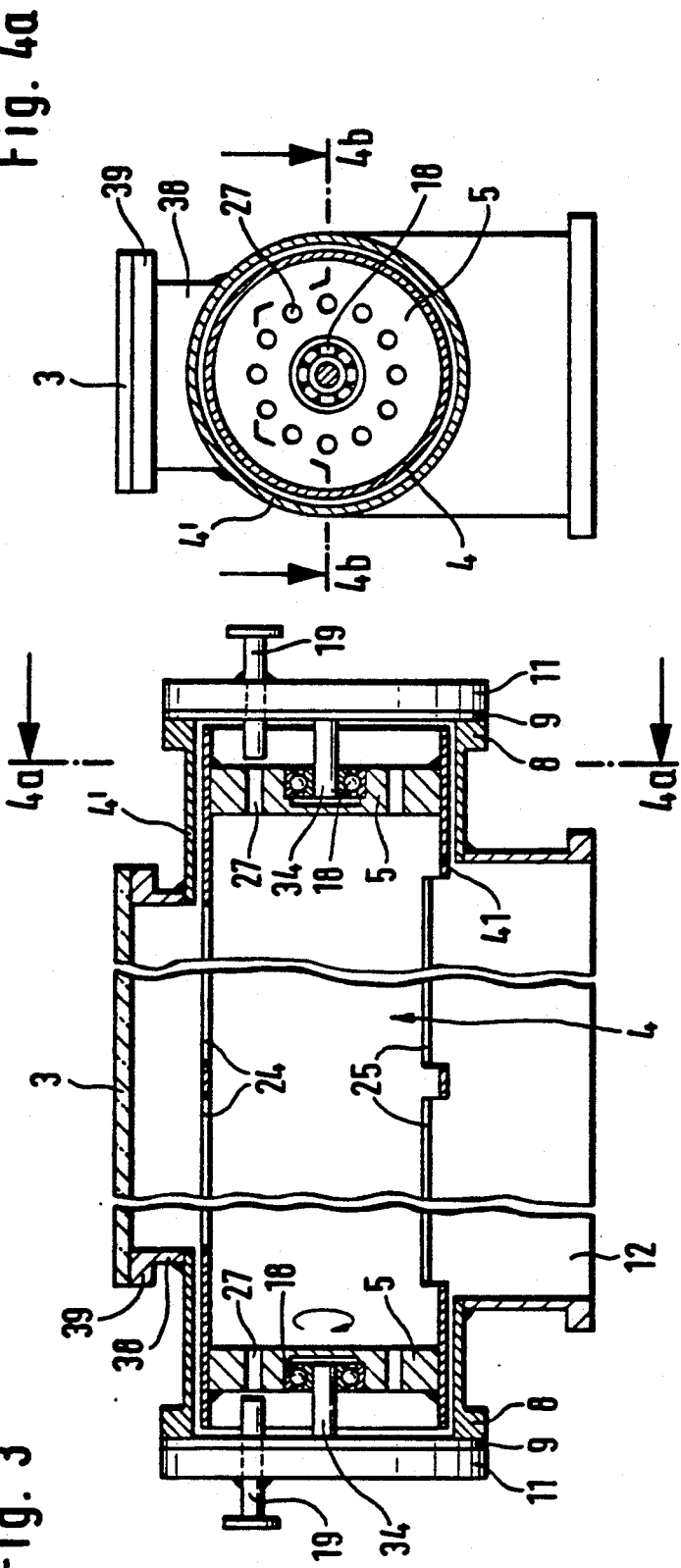

APPARATUS FOR THE OBSERVATION OF PROCESSES

BACKGROUND OF THE INVENTION

The invention describes apparatus for the observation of processes, especially of processes in vacuum technology, with a viewing glass disposed behind a chamber, past which a rotating device moves to prevent contamination of the viewing glass.

It is generally known to provide a hand shutter on a viewing glass on the wall of an opaque chamber. Here the danger is that if the shutter is open too long, severe contamination of the viewing glass will occur, rendering it opaque. This opaque condition will preclude further satisfactory observation of the process.

To minimize the chance for an opaque observation glass, it is known that the observation glass can be wiped with oil before the vapor depositing process is initiated so as to protect it from being vapor-coated subsequently. This method of preventing observation glass contamination is very problematical from a technical viewpoint because the oil impairs vision through the glass and can also result in contaminating the substrate being coated in the process.

Another way to alleviate the problem is a disk stroboscope which is driven at the center by a motor. Since a motor disposed in this manner occupies a great amount of space, the disk has to be very large so that there will be enough room alongside the motor for an opening through which the process in the vacuum chamber can be observed.

SUMMARY OF THE INVENTION

Accordingly, it is the object of the present invention to find a simple, economical apparatus, through which processes, especially processes in vacuum technology and evaporation boats can be observed through a viewing glass easily and undisturbedly over a long period of time.

The invention solves the problem in that the apparatus for preventing contamination of the viewing glass is in the form of a cylindrical rotating body on which is provided, on one side, an entrance aperture and, on the other side, diametrically opposite it, an exit aperture. In this manner an apparatus is created in a simple and hence inexpensive manner for the observation of processes, whereby processes can be observed through a viewing glass over a very long period of time without the risk of contamination of the viewing glass. Since the motor, due to the advantageous configuration of the rotating device, can be provided outside of the vacuum chamber, the possibility exists for making the rotating device substantially smaller and therefore for making it less expensively.

It is has been further found that the diametrically opposite apertures be disposed on the central transverse plane. The tube is configured as a tubular stroboscope which is rotatably mounted in a vacuum chamber. Thus it is possible to observe a greater area in the vacuum chamber without the danger that the viewing glass being wetted, even after a long period of operation. Due to the rotating drum of the tubular stroboscope, deposits build up only on the surface of the tubular stroboscope. The use of a tubular stroboscope also offers the possibility of making the tube and the corresponding apertures relatively large, so that several persons can simultaneously observe the process by means of a single tubular stroboscope, especially because the drive is coaxial with the tube. Thus the view behind the viewing glass is not blocked.

Another possibility is for the tubular stroboscope to be rotatably mounted by means of a vacuum shaft seal and to be driven via a mechanical transmission device, such as a shaft.

Another embodiment is for the tubular stroboscope to be driven by a motor provided outside of the vacuum chamber, which is in a driving connection with the tube through the vacuum shaft seal. In this manner it is much easier to provide electrical connections to the motor. Depending on the particular embodiment, however, it is also possible to provide the motor within the vacuum chamber.

Lastly, according to a preferred embodiment of the invention, the tubular stroboscope is coupled to the motor by a magnetic clutch, one part of the magnetic clutch being inside the vacuum chamber while the other part of the magnetic clutch is outside of the vacuum chamber.

Another aspect of the present invention is that a gas driven drive wheel is provided as the driving device, and is drivingly coupled with the tube. Such a drive means consists of at least one nozzle which is drivingly coupled with a drive wheel having elements to be driven. In this manner a driving device for the cylindrical tube is created with simple construction means which can easily be integrated into the apparatus.

Furthermore, it is advantageous that the jet nozzle be disposed at an angle to the axis of rotation of the tubular stroboscope and/or the drive wheel. In this manner a very inexpensive, easy-to-install, apparatus is created for driving the tubular stroboscope. For the degassing of steel, the invention calls for the use of a tubular stroboscope which is driven only by argon gas, i.e., runs without an electric motor. The advantage of this apparatus would be a certain excess pressure of argon in the tubular stroboscope itself. This argon cushion additionally combats severe contamination of the viewing glass.

An additional possibility is to provide an aspirator near to the viewing glass and/or the tubular stroboscope, by which the dirt particles from the space containing the tubular stroboscope can be sucked away. In this manner, the life of the stroboscope can be lengthened and the viewing glass can be prevented from becoming smudged too quickly.

In a further development of the invention, the aperture on the entry side, with respect to the ray path, is smaller than the one provided on the exit side. This feature facilitates the observation of the process over a larger area.

In yet another embodiment, the apertures on the entry and exit sides are slits, the entry-side slit being at least 0.5 mm and the exit-side slit between 1 and 60 mm wide. Fouling of the viewing glass is effectively prevented by the relatively small aperture. The large slit on the exit side provides a correspondingly large field of view.

An additional improvement of the apparatus according to the invention is that the distance between the outer circumference of the tubular stroboscope and the inside surface of the viewing glass is at least 1 millimeter.

It is furthermore advantageous that the tubular stroboscope consists of a cylinder-shaped tube at each of whose ends a wheel with a hub is provided, which is held rotatably in bearings provided in flanges.

One possible variant of this apparatus is direct installation on a vacuum tank with standard parts. Such apparatus is found, for example, in vapor deposition apparatus wherein films are fed at high running speeds to a vapor depositing source and are coated with aluminum.

The invention is used, for example, in large industrial vapor depositing apparatus where plastic films are coated up to a width of 3 m. The films are wound to form a tower of about 1 m diameter. In order to assure perfect coating, the vapor depositing process (boat) must be continuously observed. The stroboscope according to the invention is suitable for this purpose, in which a plurality of slits can be provided side by side in the cylindrical tube of the stroboscope. This improves the stability of the tube with simple means.

BRIEF DESCRIPTION OF THE DRAWINGS

FIG. 3 is a second embodiment of a tubular stroboscope mounted for rotation on rolling bearings with vacuum shaft seals as bearing parts, FIG. 4a is a rear view in accordance with FIG. 3 with the corresponding drive wheel and a partial cross section of the drive wheel, FIG. 4b is a fragmentary section along line 4b—4b of FIG. 4a.

DETAILED DESCRIPTION OF THE PREFERRED EMBODIMENT

Figure 1:
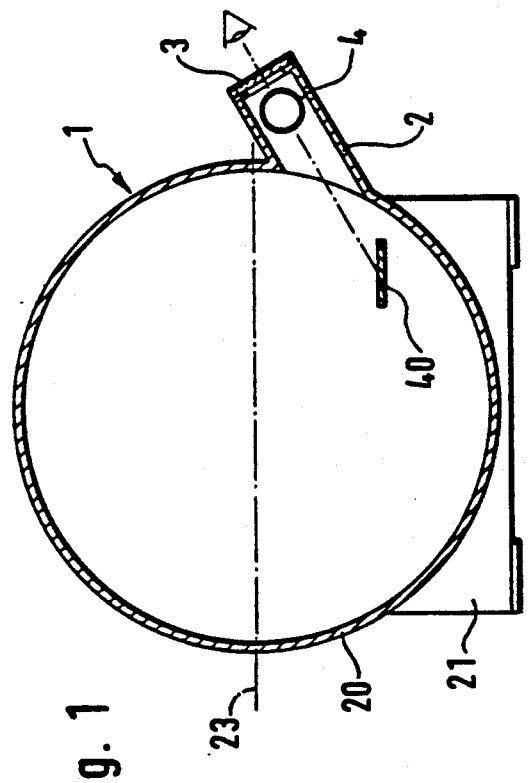
FIG. 1 is a diagrammatic cross-sectional representation of a tubular stroboscope in a vacuum band coating apparatus.

In the drawings, a vacuum apparatus or vacuum tank 1 includes a cylinder-shaped tube 20. On the vacuum tank 1 there is a rectangular base 21 which rests on the floor.

Slightly below a horizontal central plane 23 there is mounted a viewing glass box 2 which is inclined with respect to the floor on which the vacuum tank 1 rests, by means of which it is possible, for example, to look into the vacuum tank 1 through a viewing glass mounted on the viewing glass box 2, and have a good view of an evaporation boat 40 and other parts provided in the tank 1 and of the ongoing processes.

The viewing glass box 2 consists of a cylindrical tube 4' for the accommodation of a tubular stroboscope 4 which consists of a cylindrical tube 41 on each of whose ends is a disk 5 with a hub 34. The tube 4' has two flanges 8, one on the right and one on the left directly beside the viewing glass 3, which are coaxially disposed and in mirror-image symmetry with the viewing glass box 2. The flanges 8 are integral with or welded to the tube 4' or otherwise fastened thereto.

Centrally between the two flanges 8 the tube 4' contains the tubular stroboscope 4 which covers the entire space between the two flanges 8. The tubular stroboscope 4 has at least one, preferably two or even more, oppositely situated, small observation apertures or slits 24 and 25 (cf. FIG. 6).

Figure 2:
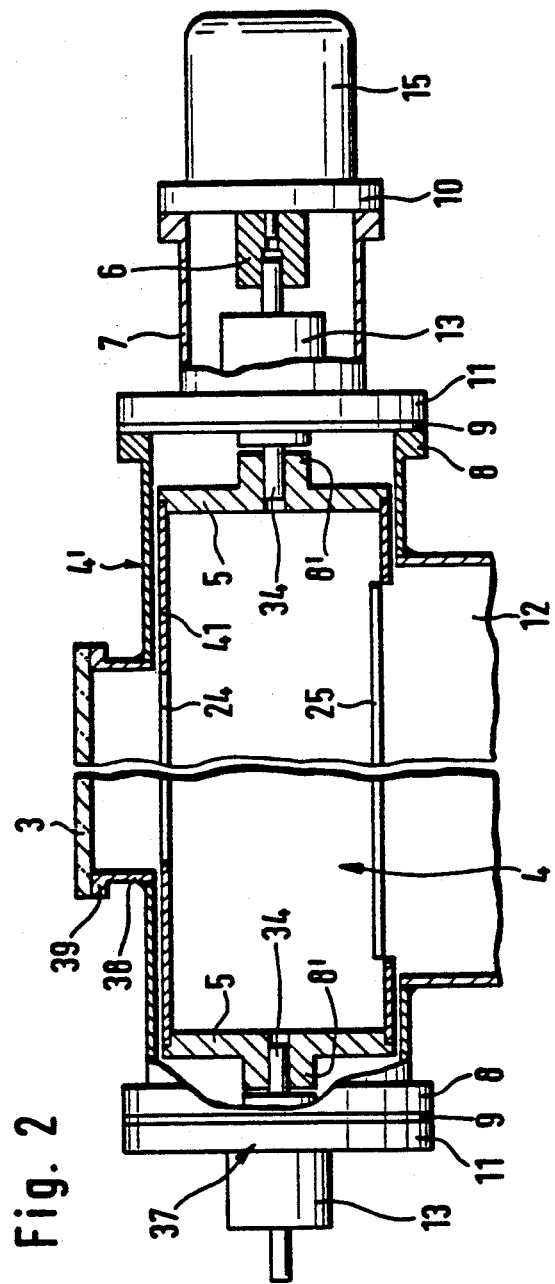
FIG. 2 is a longitudinal cross section of a tubular stroboscope in a vacuum band coating apparatus.

A shown in FIG. 2, on the end of the tubular stroboscope 4 (FIG. 2) are coaxially disposed bosses 8', each on a disk 5 welded or permanently joined to the tubular stroboscope 4. This tubular stroboscope 4 is mounted on vacuum shaft seals 13 (FIG. 2) which are held concentrically in the two flanges 11 and in a tubular extension 7 disposed on flange 8. The tubular extension 7 of cylindrical shape is welded at one end to the flange 11. The sealing of the flange 8 provided on the end of tube 4' and the corresponding flange 11 is provided by vacuum seals 9 situated between flanges 8 and 11 at each end.

According to FIG. 2, the vacuum shaft seal 13 can be equipped with a friction bearing 37 not shown in detail.

With reference to FIGS. 2 and 3, a flange 39 is provided on the upper end of a nipple 38 and the viewing glass is sealingly fastened thereon.

On the tube 7 there is a flange 10 which is coaxial with the, longitudinal central axis of the tube 4'. A motor 15 is fixed to the flange 10.

Figure 5:
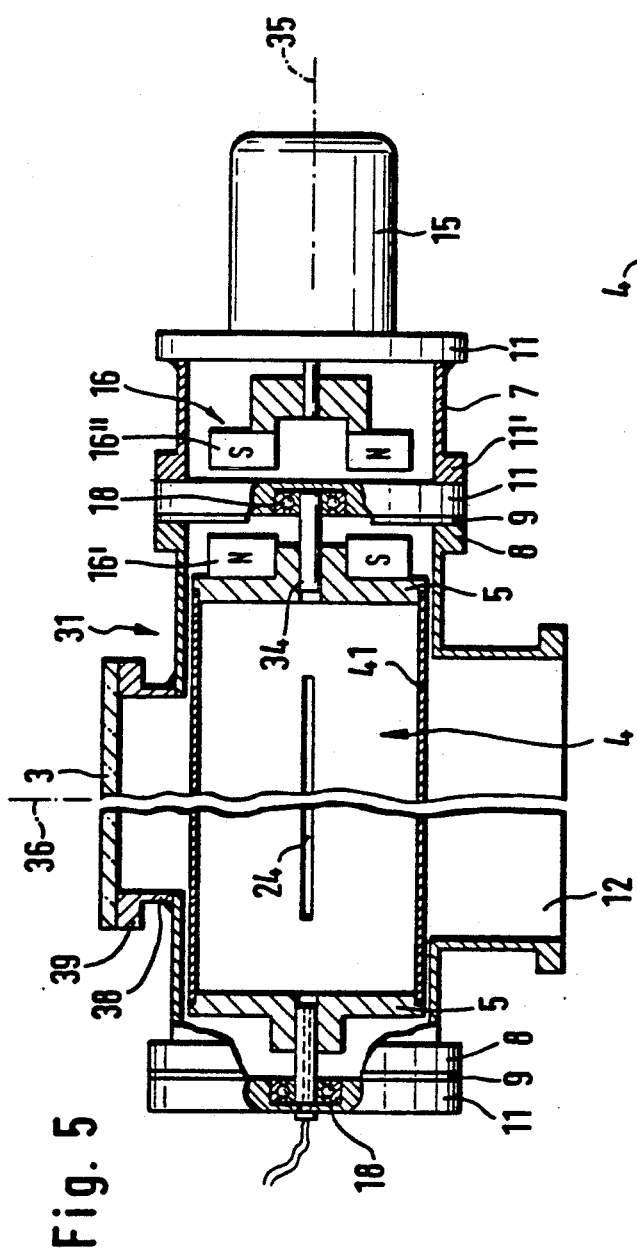
FIG. 5 is a longitudinal section through a third embodiment of a tubular stroboscope with a magnetic clutch provided between the motor and the stroboscope.

The motor 15 has an axis 35 (FIG. 5). The central axis 36 passing through the viewing glass intersects the axis 35 at an approximately right angle.

The coupling 6 is drivingly joined to shaft 34, which passes through the vacuum shaft seal 13. The motor 15 through coupling 6 drives the tubular stroboscope at a speed between 960 to 1200 rpm, so that at least 16 images can be produced per second.

As it furthermore appears from FIGS. 2, 3 and 5, diametrically opposite the neck 38 there is provided a tee piece 12 with a nominal inside diameter of 100 mm, which is matched to the cylinder-shaped outer circumference of the tank 1 so that the tee piece 12 can be brought relatively tightly against the rounded outer circumference of the tank 1 in accordance with FIG. 1.

Figure 6:
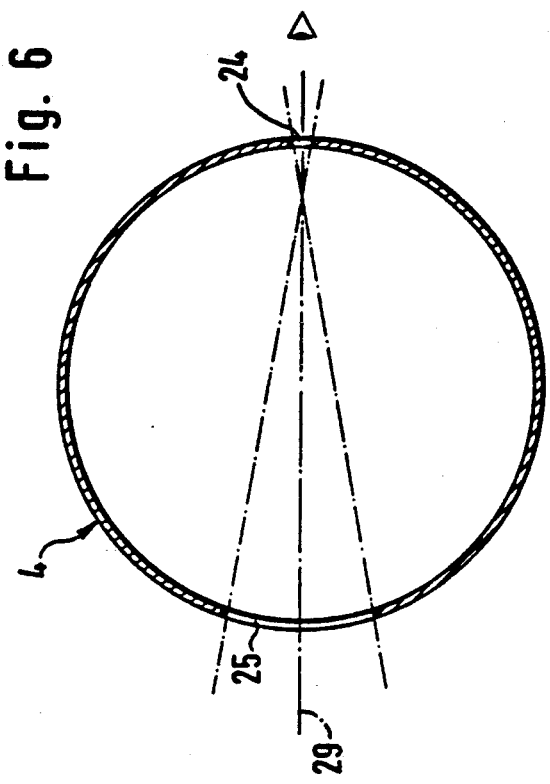
FIG. 6 shows the apertures provided in the tubular stroboscope for observing the processes.

The tubular stroboscope 4 is provided between the viewing glass 3 and flange 39 and the tee piece 12 and, as already mentioned, is provided with two oppositely situated longitudinal slits 24 and 25 as shown in FIG. 6. The slot 24 on the entry side should be at least 0.5 mm wide, while the slot 25 on the exit side should be larger, e. g., between 1 mm and 60 mm, preferably 50 mm. This prevents a dirt film from forming on the viewing glass, since the dirt particles can now be deposited mainly on the cylinder shaped tubular stroboscope.

Since embodiments of FIGS. 3 and 5 are similar, with only slight differences, as compared to the embodiment shown in FIG. 2, to avoid repetition only the differences will be explained in the case of FIGS. 3 and 5.

The tubular stroboscope 4 is mounted, according to FIG. 2, on the vacuum shaft seals 13, which are centered in the flanges 11. The flange 11 can have a diameter between 100 and 150 mm, especially 130 mm. Thus a very space-saving arrangement is achieved for the tubular stroboscope in back of the viewing glass 3.

In the embodiment according to FIG. 3, ball bearings 18 are mounted in discs 5 of the tube 4.

The embodiment in FIG. 5 differs from the embodiment in FIG. 3 in the particular mounting and manner of driving the tubular stroboscope 4'. Here the two ball bearings 18 are fixed in the aluminum blind flanges 11 with a nominal diameter of 100 mm.

The two flanges 11 are sealed by the vacuum gaskets 9 against the flange 8. To this end the flanges 11 are bolted to the flange 8 and thus sealed against the atmosphere.

Furthermore, a flange 11' on the tube 7 is centered on one side of the flange 11, the tube containing the motor 15 with a magnetic clutch 16 through which the tubular stroboscope is driven. One part 16' of the magnetic clutch is directly coupled with the stroboscope 4 and the mounting disk 5 attached to it, while the other part 16" is disposed on the left of flange 11 in tube 7 outside of the vacuum chamber 31, and is connected to the motor 15. In this manner the relatively expensive vacuum shaft seal 13 seen in FIG. 2 can be avoided.

Referring to FIG. 3, each mounting disk 5 configured as a bucket wheel driven by a gas (e.g. argon) flowing through jets 19 provided in the blind flanges 11 (cf. FIG. 4b), and through the openings 27 which are provided in the disk 5. In this manner the tubular stroboscope is made to rotate in a very inexpensive manner. To compensate imbalances the rotating parts, especially the disk 5, can be provided with balancing holes.

In all of the embodiments, the stroboscope 4 is journaled directly behind the viewing glass 3 in the vacuum tank 1. Furthermore, it can be provided with an aspirator so as to assure, in the case of very strong vapor depositing, that the dust or dirt particles are sucked away, which otherwise would deposit themselves on the viewing glass.

With this apparatus the evaporation boats 40, or the progress of any vacuum process, especially of vapor depositing, can be easily observed while its occurring inside the tank.

As it can be seen in FIG. 6, instead of the slits 24 and 25, a greater number of slits can be disposed in the tube 4' diametrically opposite one another or beside one another on a longitudinal central plane 29. In this manner several persons at once can observe the process through the stroboscope. The size of the slits or the special configuration of the slits 24 and 25 can be varied to adapt to the process and the apparatus. In the embodiment the slits on the entrance side are at least 0.1 mm and on the exit side about 50 mm wide.

Although the present invention has been shown and described with respect to preferred embodiments, various changes and other modifications which are obvious to persons skilled in the art to which the invention pertains are deemed to lie within the spirit and scope of the invention. For example, the above-described embodiments utilize specific dimensions that can be obviously modified.

I claim:

1. Apparatus for viewing a process comprising
   a viewing glass defining a line of sight between said viewing glass and the process to be viewed,
   a tubular member interposed between said viewing glass and the process to be viewed, said tubular member having an axis of rotation transverse to said line of sight and a pair of diametrically opposed slits parallel to said axis, one of said slits being substantially wider, measured circumferentially, than the opposite slit, and
   drive means for effecting rotation of said tubular member.

2. Apparatus as in claim 1 wherein said one of said slits is between 1 and 60 mm wide, measured circumferentially, and the opposite slit is at least 0.5 mm wide.

3. Apparatus as in claim 1 wherein said drive means comprises a drive wheel and a jet nozzle which directs a gas against said drive wheel to effect rotation thereof.

4. Apparatus as in claim 3 wherein said drive means comprises a pair of drive wheels fixed in opposite ends of said tubular member, and a pair of jet nozzles which direct a gas against respective drive wheels.

5. Apparatus as in claim 1 wherein said apparatus further comprises a chamber in which said process takes place, said chamber having wall means in which said viewing glass is fixed.

6. Apparatus as in claim 5 wherein said drive means comprises
   first magnetic means fixed to said tubular member inside said chamber,
   second magnetic means rotatably mounted outside said chamber and magnetically coupled to said first magnetic means, and
   motor means for rotating said second magnetic means.

7. Apparatus for viewing a process comprising
   a chamber in which said process takes place, said chamber having wall means,
   a viewing glass in said wall means, said viewing glass defining a line of sight between said viewing glass and the process to be viewed,
   a tubular member interposed between said viewing glass and the process to be viewed, said tubular member having an axis of rotation transverse to said line of sight and a pair of diametrically opposed slits parallel to said axis, and
   drive means comprising a drive wheel fixed in an end of said tubular member and a jet nozzle for directing a gas against said drive wheel to effect rotation.

* * * * *